(12) United States Patent
Jogan et al.

(10) Patent No.: US 8,658,449 B2
(45) Date of Patent: Feb. 25, 2014

(54) SEMICONDUCTOR LAYER, METHOD OF MANUFACTURING THE SAME, LASER DIODE, AND METHOD OF MANUFACTURING THE SAME

(75) Inventors: Naoki Jogan, Kanagawa (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 153 days.

(21) Appl. No.: 12/662,099

(22) Filed: Mar. 31, 2010

(65) Prior Publication Data
US 2010/0260222 A1   Oct. 14, 2010

(30) Foreign Application Priority Data

Apr. 14, 2009 (JP) ................................ 2009-098020

(51) Int. Cl.
*H01L 21/18* (2006.01)
*C30B 25/14* (2006.01)

(52) U.S. Cl.
USPC ............... 438/46; 438/47; 438/507; 438/935; 117/89; 117/93; 117/954; 257/615; 257/E21.097

(58) Field of Classification Search
USPC .......... 438/46, 47, 478, 507, 935; 117/89, 93, 117/954; 257/615, E21.097
See application file for complete search history.

(56) References Cited

U.S. PATENT DOCUMENTS

| | | | | |
|---|---|---|---|---|
| 4,427,841 A | * | 1/1984 | Rahilly | 136/255 |
| 4,455,564 A | * | 6/1984 | Delagebeaudeuf et al. | 257/194 |
| 4,756,074 A | * | 7/1988 | Lewis | 438/74 |
| 4,767,494 A | * | 8/1988 | Kobayashi et al. | 117/93 |
| 4,771,321 A | * | 9/1988 | Lewis | 136/249 |
| 4,829,021 A | * | 5/1989 | Fraas et al. | 438/167 |
| 4,881,979 A | * | 11/1989 | Lewis | 136/249 |
| 4,939,456 A | * | 7/1990 | Morelli et al. | 324/207.21 |
| 5,081,404 A | * | 1/1992 | Kelley et al. | 318/434 |
| 5,332,451 A | * | 7/1994 | Hata et al. | 148/33.2 |
| 5,508,225 A | * | 4/1996 | Kadoiwa | 438/40 |
| 5,603,764 A | * | 2/1997 | Matsuda et al. | 117/89 |

(Continued)

FOREIGN PATENT DOCUMENTS

| | | | | |
|---|---|---|---|---|
| JP | 62-182195 | * | 8/1987 | ............ H01L 21/205 |
| JP | 63-85098 | * | 4/1988 | ............ H01L 21/205 |

(Continued)

OTHER PUBLICATIONS

S. Minagawa et al., "Effect of Cap Layer and Cooling Atmosphere on the Hole Concentration of p(Zn)-AlGaInP Grown by Organometallic Vapor Phase Epitaxy," Journal of Crystal Growth 118 (1992), pp. 425-429.

*Primary Examiner* — Mary Wilczewski
(74) *Attorney, Agent, or Firm* — Rader, Fishman & Grauer PLLC

(57) ABSTRACT

A method of manufacturing a semiconductor layer with which inactivation of impurity is able to be inhibited by a simple method, a semiconductor layer in which inactivation of impurity is inhibited, a method of manufacturing a laser diode with which inactivation of impurity is able to be inhibited by a simple method, and a laser diode including a semiconductor layer in which inactivation of impurity is inhibited are provided. In the method of manufacturing a semiconductor layer, after a semiconductor layer is formed by epitaxial growth with the use of $AsH_3$, supply of $AsH_3$ is stopped without separately supplying new gas when process temperature is 500 deg C. or more.

8 Claims, 4 Drawing Sheets

(56) References Cited

U.S. PATENT DOCUMENTS

| | | | |
|---|---|---|---|
| 5,763,291 A | 6/1998 | Motoda et al. | |
| 5,789,273 A | 8/1998 | Yamamoto | |
| 5,821,569 A * | 10/1998 | Dutta | 257/96 |
| 6,144,049 A * | 11/2000 | Onda | 257/194 |
| 6,200,382 B1 | 3/2001 | Fujii et al. | |
| 6,274,893 B1 * | 8/2001 | Igarashi et al. | 257/192 |
| 6,387,721 B1 * | 5/2002 | Hashimoto et al. | 438/46 |
| 6,765,232 B2 * | 7/2004 | Takahashi et al. | 257/79 |
| 6,818,521 B2 * | 11/2004 | Hiratsuka | 438/336 |
| 6,841,435 B2 * | 1/2005 | Udagawa et al. | 438/167 |
| 6,979,581 B2 * | 12/2005 | Sai | 438/22 |
| 7,034,342 B2 * | 4/2006 | Shakuda et al. | 257/94 |
| 7,391,798 B2 * | 6/2008 | Onishi et al. | 372/46.01 |
| 7,424,043 B2 * | 9/2008 | Mochizuki | 372/43.01 |
| 7,672,347 B2 * | 3/2010 | Kuromizu | 372/46.01 |
| 2003/0042502 A1 * | 3/2003 | Ohnishi et al. | 257/192 |
| 2003/0232478 A1 * | 12/2003 | Hiratsuka | 438/312 |
| 2010/0260222 A1 * | 10/2010 | Jogan et al. | 372/43.01 |

FOREIGN PATENT DOCUMENTS

| | | | | |
|---|---|---|---|---|
| JP | 6-140345 | * | 5/1994 | H01L 21/205 |
| JP | 6-310445 | * | 11/1994 | H01L 21/205 |
| JP | 2000-031600 | | 1/2000 | |
| JP | 2001-85334 | * | 3/2001 | H01L 21/205 |
| JP | 2002-26458 | * | 1/2002 | H01S 5/323 |
| JP | 3424378 | | 5/2003 | |
| JP | 3553147 | | 5/2004 | |
| JP | 2004-327679 | * | 11/2004 | H01L 21/205 |
| JP | 2009-38253 | * | 2/2009 | H01L 21/205 |
| JP | 2010-251458 | * | 11/2010 | H01L 21/205 |

* cited by examiner

000
SEMICONDUCTOR LAYER, METHOD OF MANUFACTURING THE SAME, LASER DIODE, AND METHOD OF MANUFACTURING THE SAME

BACKGROUND OF THE INVENTION

1. Field of the Invention

The present invention relates to a low-resistance semiconductor layer, a method of manufacturing the same, a laser diode including a low-resistance semiconductor layer, and a method of manufacturing the same.

2. Description of the Related Art

In the past, a phenomenon that in a p-type semiconductor crystal material, by bonding a hydrogen atom with p-type impurity, the p-type impurity is inactivated, and the carrier concentration is lowered has been known. Lowering of the carrier concentration causes high resistance, and leads to lowering life due to heat generation at the time of operation, that is, lowering of reliability. Hydrogen incorporation at the time of temperature drop after growth makes it difficult to realize a long-term stable laser operation.

The inactivation of the p-type impurity is caused by an event that hydrogen radical generated from arsine ($AsH_3$) is taken into crystal at the time of temperature drop after growth (see Japanese Patent No. 3553147). Thus, to obtain a desired carrier concentration, semiconductor should be doped with impurity beyond necessity. However, if the semiconductor is doped with impurity beyond necessity, the impurity is diffused into an active layer, or crystal defect in the p-type semiconductor is increased. In the result, there is concern that laser reliability is impaired.

Several methods to inhibit such inactivation of the p-type impurity have been already proposed. For example, in Japanese Patent No. 3553147, a method to change $AsH_3$ supplied at the time of temperature drop after growth to an organic Group V (TMAs, TBA or the like) is proposed. In the method, by using the organic Group V raw material not generating hydrogen radical instead of $AsH_3$ at the time of temperature drop after growth when hydrogen is mixed, inactivation of the p-type impurity is able to be inhibited. A similar method is described in Japanese Unexamined Patent Application Publication No. 2000-316000 as well. In Japanese Unexamined Patent Application Publication No. 2000-316000, to prevent hydrogen incorporation from $AsH_3$, nitrogen is used instead of the organic Group V at the time of temperature drop after growth.

SUMMARY OF THE INVENTION

However, in the foregoing methods, an additional raw material, changing gas and the like are necessitated. Further, most documents cite an AlGaInP-based material as a material causing the impurity inactivation. However, such an impurity inactivation may be also caused if other material such as an AlGaAs-based material is used.

In view of the foregoing, in the invention, it is desirable to provide a method of manufacturing a semiconductor layer with which inactivation of impurity is able to be inhibited by a simple method, a semiconductor layer in which inactivation of impurity is inhibited, a method of manufacturing a laser diode with which inactivation of impurity is able to be inhibited by a simple method, and laser diode including a semiconductor layer in which inactivation of impurity is inhibited.

According to an embodiment of the invention, there is provided a method of manufacturing a semiconductor layer, in which after a semiconductor layer is formed by epitaxial growth with the use of $AsH_3$, supply of $AsH_3$ is stopped without separately supplying new gas when process temperature is 500 deg C. or more.

In the method of manufacturing a semiconductor layer according to the embodiment of the invention, supply of $AsH_3$ is stopped when the process temperature is 500 deg C. or more. That is, supply of $AsH_3$ is stopped under temperature conditions in which decomposition of $AsH_3$ is not stopped. Thus, hydrogen ratio remaining in the semiconductor layer is able to be decreased than a case in which supply of $AsH_3$ is stopped under temperature conditions in which decomposition of $AsH_3$ is stopped. Further, at the time of stopping supply of $AsH_3$, new gas is not separately supplied. Thus, an additional raw material and switching gas and the like are not needed.

According to an embodiment of the invention, there is provided a semiconductor layer including a p-type laminated body that is structured by alternately layering a first p-type semiconductor layer in which an Al composition is 0.9 or more and a second p-type semiconductor layer having an Al composition smaller than the Al composition of the first p-type semiconductor layer. An activation ratio of p-type impurity contained in the p-type semiconductor layer is 80% or more.

In the semiconductor layer according to the embodiment of the invention, the activation ratio of the p-type impurity is 80% or more. That is, inactivation of the p-type impurity due to hydrogen radical is hardly shown. Thus, a high carrier concentration with small crystal defect is obtained, and a low resistance value is obtained. Such a high activation ratio is not able to be realized in the existing manufacturing methods in which a doping with large amount of dopant is made, or supply of $AsH_3$ is stopped under temperature conditions in which decomposition of $AsH_3$ is stopped at the time of temperature drop after crystal growth. To realize such a high activation ratio, it is necessary to employ the after-mentioned manufacturing method. In the method, after a semiconductor layer is formed by epitaxial growth with the use of $AsH_3$, supply of $AsH_3$ is stopped without separately supplying new gas when process temperature is 500 deg C. or more.

According to an embodiment of the invention, there is provided a method of manufacturing a laser diode including a formation step of forming a laminated structure sequentially including an n-type semiconductor layer, an active layer, and a p-type semiconductor layer. In the formation step, after the p-type semiconductor layer is formed by epitaxial growth with the use of $AsH_3$ and a first raw material gas containing a p-type impurity element, supply of $AsH_3$ is stopped without separately supplying new gas when process temperature is 500 deg C. or more.

In the method of manufacturing a laser diode according to the embodiment of the invention, supply of $AsH_3$ is stopped when process temperature is 500 deg C. or more. That is, supply of $AsH_3$ is stopped under temperature conditions in which decomposition of $AsH_3$ is not stopped. Thus, hydrogen ratio remaining in the semiconductor layer is able to be decreased than a case in which supply of $AsH_3$ is stopped under temperature conditions in which decomposition of $AsH_3$ is stopped. Further, at the time of stopping supply of $AsH_3$, new gas is not separately supplied. Thus, an additional raw material and switching gas and the like are not needed.

According to an embodiment of the invention, there is provided a laser diode sequentially including an n-type semiconductor layer; an active layer; and a p-type semiconductor layer. The p-type semiconductor layer has a structure in which a first p-type semiconductor layer in which an Al composition is 0.9 or more and a second p-type semiconductor layer having an Al composition smaller than the Al composition of the first p-type semiconductor layer are alternately layered. An activation ratio of p-type impurity contained in the p-type semiconductor layer is 80% or more.

In the laser diode according to the embodiment of the invention, the activation ratio of the p-type impurity is 80% or more. That is, inactivation of the p-type impurity due to hydrogen radical is hardly shown. Thus, a high carrier concentration with small crystal defect is obtained, and a low resistance value is obtained. Such a high activation ratio is not able to be realized in the existing manufacturing methods in which a doping with large amount of dopant is made, or supply of $AsH_3$ is stopped under temperature conditions in which decomposition of $AsH_3$ is stopped at the time of temperature drop after crystal growth. To realize such a high activation ratio, it is necessary to adopt the after-mentioned manufacturing method. In the method, after a semiconductor layer is formed by epitaxial growth with the use of $AsH_3$, supply of $AsH_3$ is stopped without separately supplying new gas when process temperature is 500 deg C. or more.

According to the method of manufacturing a semiconductor layer and the method of manufacturing a laser diode of the embodiment of the invention, the ratio of hydrogen remaining in the semiconductor layer is decreased. Thus, inactivation of impurity due to hydrogen radical is able to be inhibited. Further, inhibiting inactivation of impurity due to hydrogen radical is made by only stopping supply of $AsH_3$, and new gas is not separately supplied. Thus, in the embodiment of the invention, inactivation of impurity is able to be inhibited by a simple method.

If supply of $AsH_3$ is stopped in the case where the process temperature is in the range from 500 deg C. to 700 deg C. both inclusive, face roughing caused by As removal is able to be decreased.

According to the semiconductor layer and the laser diode of the embodiment of the invention, the activation ratio of impurity is 80% or more, and inactivation of the p-type impurity due to hydrogen radical is hardly shown. Further, such a high activation ratio is able to be obtained by the foregoing simple method. Therefore, the semiconductor layer in which inactivation of the p-type impurity due to hydrogen radical is hardly shown and the laser diode including the same are able to be obtained by the simple method.

Other and further objects, features and advantages of the invention will appear more fully from the following description.

DETAILED DESCRIPTION OF THE PREFERRED EMBODIMENT

Figure 1:
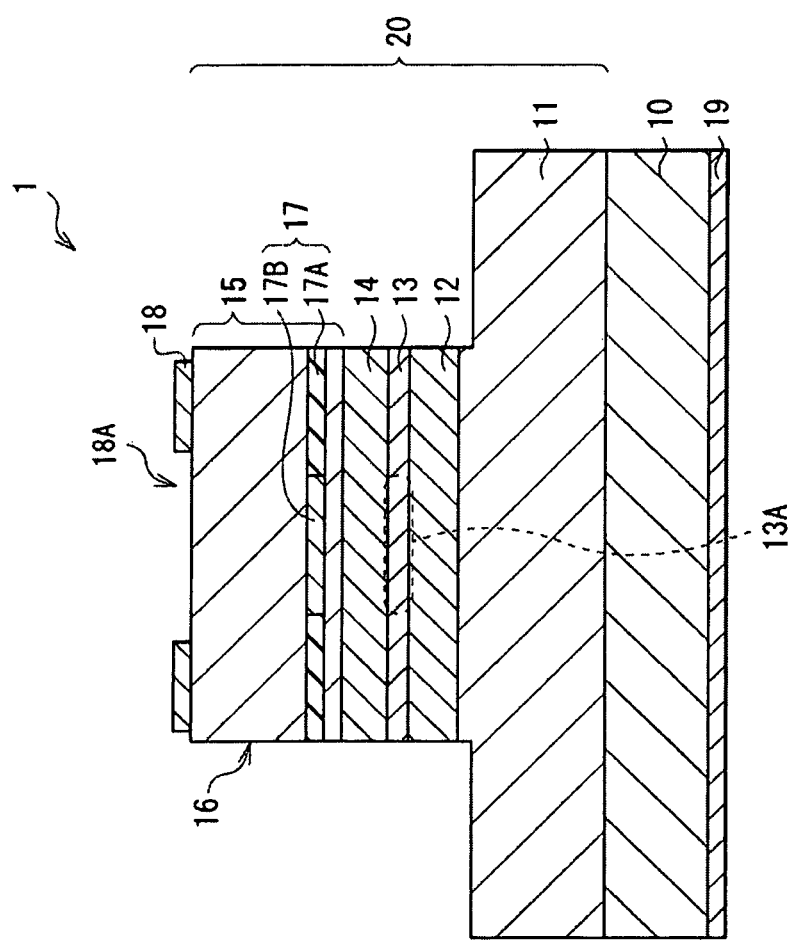
FIG. 1 is a cross sectional view of a laser diode according to an embodiment of the invention.

An embodiment of the invention will be hereinafter described in detail with reference to the drawings. The description will be given in the following order:

1. Configuration
2. Manufacturing method
3. Action and effect
   1. Configuration FIG. 1 illustrates a cross sectional configuration of a Vertical Cavity Surface Emitting Laser 1 according to an embodiment of the invention. FIG. 1 is a schematic view, and thus the dimensions and the shape thereof is different from the actual dimensions and the actual shape. The laser diode 1 includes a laminated structure 20 in which a lower DBR layer 11, a lower spacer layer 12, an active layer 13, an upper spacer layer 14, and an upper DBR layer 15 are layered in this order on one face side of a substrate 10. The laminated structure 20 corresponds to a specific example of "laminated structure" of the invention. The upper section of the laminated structure 20, specifically, part of the lower DBR layer 11, the lower spacer layer 12, the active layer 13, the upper spacer layer 14, and the upper DBR layer 15 configure a columnar mesa 16 having a width of, for example, about 40 µm. Further, the laser diode 1 includes a current narrowing layer 17 in the mesa 16, for example, in the lower DBR layer 11, between the lower DBR layer 11 and the lower spacer layer 12, between the upper spacer layer 14 and the upper DBR layer 15, or in the upper DBR layer 15. FIG. 1 exemplifies a case that the current narrowing layer 17 is provided in the upper DBR layer 15.

The substrate 10 is, for example, an n-type GaAs substrate. Examples of n-type impurities include silicon (Si) and selenium (Se). The lower DBR layer 11 has a laminated structure in which, for example, a low-refractive index layer (not illustrated) and a high-refractive index layer (not illustrated) are alternately layered. The low-refractive index layer is composed of, for example, n-type $Al_{x1}Ga_{1-x1}As$ (0<x1<1) having an optical thickness of $\lambda/4$ ($\lambda$ is an oscillation wavelength). The high-refractive index layer is composed of, for example, n-type $Al_{x2}Ga_{1-x2}As$ (0<x2<x1) having an optical thickness of $\lambda/4$. The lower DBR layer 11 corresponds to a specific example of "n-type semiconductor layer" of the invention.

The lower spacer layer 12 is composed of, for example, $Al_{x3}Ga_{1-x3}As$ (0<x3<1). The active layer 13 is composed of, for example, a GaAs-based material. The active layer 13 includes a light emitting region 13A located in a region opposed to an after-mentioned current injection region 17B. The upper spacer layer 14 is composed of, for example, $Al_{x4}Ga_{1-x4}As$ (0<x4<1). The lower spacer layer 12, the active layer 13, and the upper spacer layer 14 desirably do not contain impurity, but p-type or n-type impurity may be contained therein.

Figure 2:
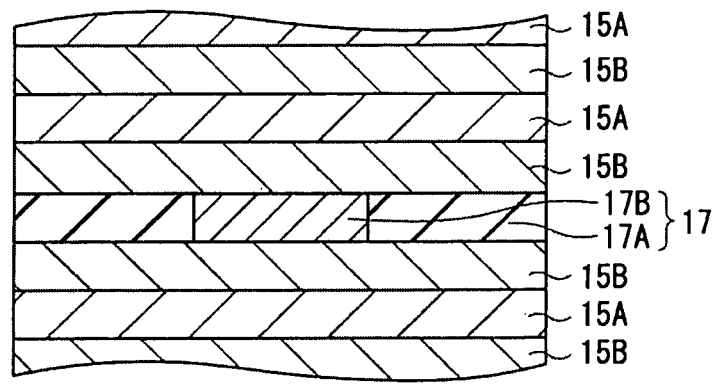
FIG. 2 is a cross sectional view of the upper DBR layer and the current narrowing layer of FIG. 1.

For example, as illustrated in FIG. 2, the upper DBR layer 15 has a laminated structure in which a low-refractive index layer 15A and a high-refractive index layer 15B are alternately layered. The low-refractive index layer 15A is composed of, for example, p-type $Al_{x5}Ga_{1-x5}As$ (0<x5<1) having an optical thickness of $\lambda/4$. The high-refractive index layer 15B is composed of, for example, p-type $Al_{x6}Ga_{1-x6}As$ (0<x6<x5) having an optical thickness of $\lambda/4$. Examples of the p-type impurity include carbon (C), magnesium (Mg), and zinc (Zn). The upper DBR layer 15 corresponds to a specific example of "p-type laminated body" and "semiconductor layer" of the invention. Further, the low-refractive index layer 15A corresponds to a specific example of "first p-type semiconductor layer" of the invention, and the high-refractive index layer 15B corresponds to a specific example of "second p-type semiconductor layer" of the invention.

In terms of obtaining high reflectance of the upper DBR layer 15, refractive index difference between the low-refractive index layer 15A and the high-refractive index layer 15B is preferably large. For example, in the case where the low-refractive index layer 15A and the high-refractive index layer 15B are composed of AlGaAs, it is preferable that the Al composition of the low-refractive index layer 15A is 0.9 or more, and the Al composition of the high-refractive index layer 15B is about 0.1. Specifically, it is preferable that the low-refractive index layer 15A is composed of $Al_{0.9}Ga_{0.1}As$, and the high-refractive index layer 15B is composed of $Al_{0.12}Ga_{0.88}As$. The Al composition of the high-refractive index layer 15B is preferably a value in the range in which light generated from the active layer 13 is not absorbed.

For example, as illustrated in FIG. 2, the current narrowing layer 17 has a current narrowing region 17A in a region from the side face of the mesa 16 to a given depth, and has a current injection region 17B in the region other than the current narrowing region 17A (central region of the mesa 16). The current injection region 17B contains, for example, p-type $Al_{x7}Ga_{1-x7}As$ ($x5<x7\leq1$). The current narrowing region 17A contains, for example, $Al_2O_3$ (aluminum oxide). The current narrowing region 17A is formed by oxidizing highly concentrated Al contained in an oxidized layer 17D from the side face as will be described later. Therefore, the current narrowing layer 17 has a function to narrow a current. In the case where the current narrowing layer 17 is provided in the upper DBR layer 15 as illustrated in FIG. 1 and FIG. 2, the current narrowing layer 17 is provided instead of the low refractive layer 15A in a position of such a substituted low refractive index layer 15A apart from the active layer 13 side by a given distance.

A circular upper electrode 18 having an aperture (light emitting aperture) 18A in a region including a region opposed to the current injection region 17B is formed on the top face of the mesa 16 (top face of the upper DBR layer 15). A protective film (not illustrated) is formed on the side face of the mesa 16 and on the surrounding surface. On the rear face of the substrate 10, a lower electrode 19 is provided.

The upper electrode 18 has a structure in which, for example, an alloy of gold (Au) and germanium (Ge), nickel (Ni), and gold (Au) are layered in this order. The upper electrode 18 is electrically connected to the top face of the mesa 16. The lower electrode 19 has a structure in which, for example, an alloy of Au and Ge, Ni, and Au are layered sequentially from the substrate 10 side. The lower electrode 19 is electrically connected to the substrate 10. The protective film is made of an insulating material such as an oxide and a nitride.

In this embodiment, the activation ratio of the p-type impurity contained in the upper DBR layer 15 is 80% or more. That is, inactivation of the p-type impurity due to after-mentioned hydrogen radical is not almost shown. Thus, in the upper DBR layer 15, the carrier concentration is high, and the resistance value is low. Such a high activation ratio is not able to be realized in the existing manufacturing methods in which doping with large amount of dopant is made, or supply of $AsH_3$ is stopped under temperature conditions in which decomposition of $AsH_3$ is stopped at the time of temperature drop after crystal growth. To realize such a high activation ratio, it is necessary to employ the after-mentioned manufacturing method. A description will be given in detail of the method.

2. Manufacturing Method

Figure 3A:
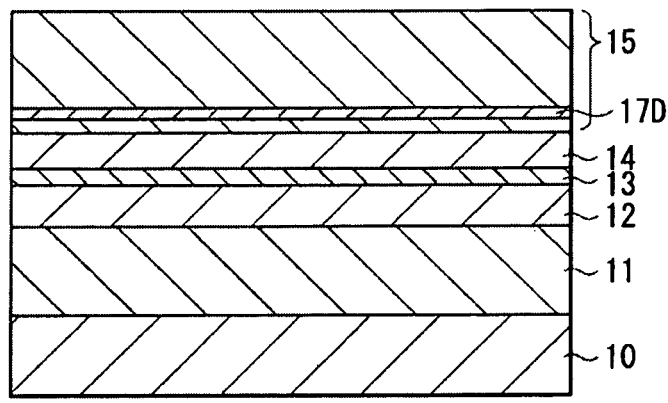
FIGS. 3A and 3B are cross sectional views for explaining a manufacturing process of the laser diode of FIG. 1.
Figure 3B:
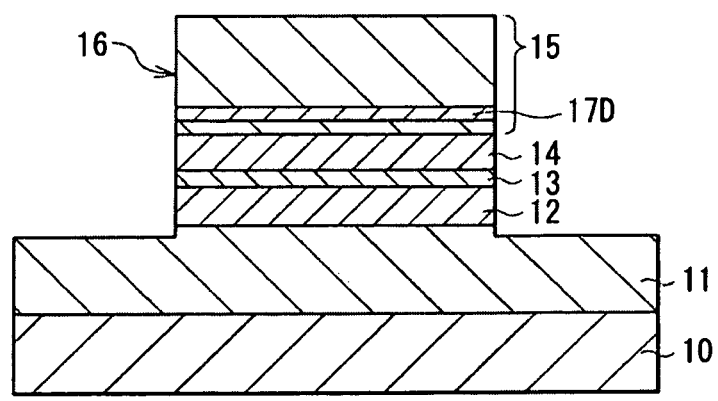
Figure 4:
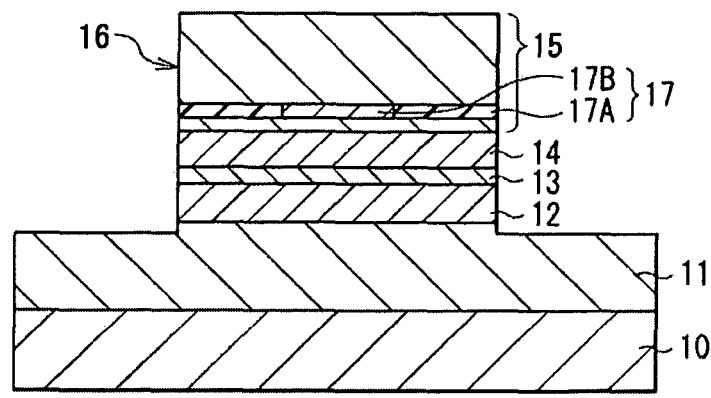
FIG. 4 is a cross sectional view for explaining a process following FIGS. 3A and 3B.

FIGS. 3A, 3B, and 4 illustrate the manufacturing method in order of steps. FIGS. 3A, 3B, and 4 illustrate a cross sectional structure of a device in the manufacturing processes.

In the method, a compound semiconductor layer on an n-type GaAs substrate is formed by MOCVD (Metal Organic Chemical Vapor Deposition) method. At this time, as a raw material of Group III-V compound semiconductor, for example, trimethyl aluminum (TMA), trimethyl gallium (TMG), trimethyl indium (TMIn), or arsine ($AsH_3$) is used. As a raw material of n-type impurity, for example, $H_2Se$ is used. As a raw material of the p-type impurity, for example, dimethyl zinc (DMZ) is used.

First, the lower DBR layer 11, the lower spacer layer 12, the active layer 13, the upper spacer layer 14, and the upper DBR layer 15 are layered over the substrate 10 in this order (FIG. 3A). At this time, for example, the oxidized layer 17D is formed in a given position inside the upper DBR layer 15. The oxidized layer 17D is a layer that will become the current narrowing layer 17 by being oxidized in the subsequent oxidation step, and contains, for example, AlAs.

Next, a photoresist is formed over the entire top face of the upper DBR layer 15. After that, photolithography and development process are provided, and thereby a circular resist layer (not illustrated) having the same diameter as the diameter of the mesa 16 is formed. Next, for example, with the use of the resist layer as a mask, selective etching is made at least down to the depth reaching the upper section of the lower DBR layer 11 by, for example, Reactive Ion Etching (RIE) method to form the columnar mesa 16. (FIG. 3B).

Next, oxidation treatment is performed at high temperature in the water vapor atmosphere to selectively oxidize the oxidized layer 17D from the side face of the mesa 16 (FIG. 4). Thereby, in the oxidized layer 17D, a region from the side face to a given depth becomes an oxidized region (insulating region) containing aluminum oxide, which becomes the current narrowing region 17A. A region deeper than the current narrowing region 17A becomes a non-oxidized region, which becomes the current injection region 17B. Accordingly, the current narrowing layer 17 is formed.

Next, the circular upper electrode 18 is formed on the top face of the mesa 16, and the protective film is formed on the side face of the mesa 16 and the peripheral surface. Further, the lower electrode 19 is formed on the rear face of the substrate 10. Consequently, the laser diode 1 of this embodiment is manufactured.

In the manufacturing method of this embodiment, the upper DBR layer 15 is formed by epitaxial growth. After completing crystal growth, at the time of transition to the next step, the following procedure is made.

Figure 5:
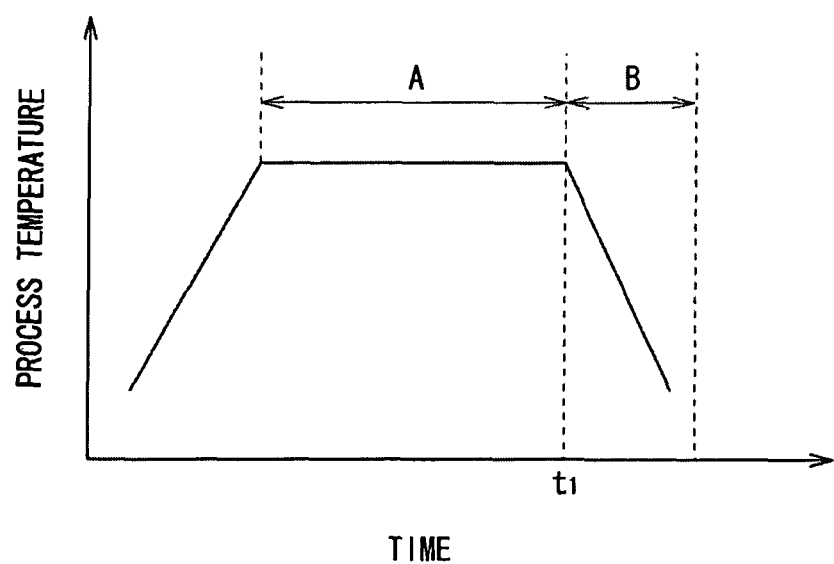
FIG. 5 is a diagram illustrating temperature change in the process of FIGS. 3A and 3B.

FIG. 5 illustrates an example of temperature change in formation process A in which the lower DBR layer 11 to the upper DBR layer 15 are formed on the substrate 10 and transition process B as a transition to the next step.

In the formation process A, for example, in the case where the upper DBR layer 15 is formed by epitaxial growth, first, the process temperature is set to a given temperature (for example, 600 deg C. or more), and $H_2$ atmosphere of the chamber is obtained. Subsequently, for example, TMA (second raw material gas) as Al raw material gas, TMG as Ga raw material gas, $AsH_3$ as As raw material gas, and DMZ (first raw material gas) as p-type impurity raw material gas are flown into the $H_2$ atmosphere at given flow rate each. In the result, a laminated body (upper DBR layer 15) in which a p-type semiconductor layer (low-refractive index layer 15A) in which As is contained and the Al composition is 0.9 or more and a p-type semiconductor layer (high-refractive index layer 15B) having the Al composition smaller than the Al composition of the low-refractive index layer 15A are alternately layered is formed.

After the upper DBR layer 15 is formed as described above, at the stage when crystal growth is completed (time $t_1$ in the figure), for example, supply of TMA, TMG; and DMZ is stopped, lowering of the process temperature (setting temperature in the chamber) (temperature drop) is started to shift to the transition process B. Temperature drop is made by, for example, turning off the heater (not illustrated) used at the time of crystal growth.

Supply of $AsH_3$ is stopped when the process temperature is 500 deg C. or more. At this time, new gas alternative to $AsH_3$, for example, organic As, nitrogen or the like is not separately supplied. That is, supply of $AsH_3$ is stopped without separately supplying new gas.

Timing of stopping supply of $AsH_3$ depends on the process temperature at the stage when crystal growth is completed. In the case where the process temperature at the time $t_1$ is in the range from 500 deg C. to 700 deg C. both inclusive (for example, 600 deg C.), it is possible to stop supply of $AsH_3$ concurrently with, for example, completing crystal growth. Further, in the case where the process temperature at the time $t_1$ is in the range from 500 deg C. to 700 deg C. both inclusive (for example, 600 deg C.), it is possible to stop supply of $AsH_3$ during time from when the process temperature starts to be dropped until when the process temperature becomes lower than 500 deg C. That is, in the case where the process temperature at the time $t_1$ is in the range from 500 deg C. to 700 deg C. both inclusive (for example, 600 deg C.), it is possible to stop supply of $AsH_3$ concurrently with starting temperature drop, or in the course of temperature drop. Further, in the case where the process temperature at the time $t_1$ exceeds 700 deg C., it is possible to stop supply of $AsH_3$ during time from when the process temperature starts to be dropped until when the process temperature falls in the range from 500 deg C. to 700 deg C. both inclusive (for example, 600 deg C.).

Next, a description will be given of a reason why the process temperature range is set to from 500 deg C. to 700 deg C. both inclusive at the time of stopping supply of $AsH_3$. If the process temperature is sufficiently high, specifically, is 500 deg or more, $AsH_3$ is decomposed into As and hydrogen radical. Thereby, a pressure of As in gas phase is applied to the crystal surface. Thus, by supplying $AsH_3$ after crystal growth, As is removed from the upper DBR layer 15, and face roughing is able to be prevented from being generated. However, in the case where the process temperature is in the range from 500 deg C. to 700 deg C. both inclusive, even if As in gas phase does not exist, the ratio of As removal from the upper DBR layer 15 is low. Thus, in the case where the process temperature is in the foregoing range, even if $AsH_3$ is not supplied after crystal growth, face roughing due to As removal is able to be inhibited to the degree that the resultant is tolerably used as a device. In the case where the process temperature largely exceeds 700 deg C., if As in gas phase does not exist, As removal from the crystal surface is intense, and surface roughing is generated to the degree that the resultant is not tolerably used as a device. Thus, at the time of stopping supply of $AsH_3$, the process temperature is preferably 700 deg C. or less.

Further, as described above, in the case where the process temperature is in the range from 500 deg C. to 700 deg C. both inclusive, $AsH_3$ is decomposed into As and hydrogen radical. Thus, in the case where the process temperature is in the foregoing range, when $AsH_3$ is supplied, hydrogen radical repeatedly enters and exits crystal. However, in the case where the process temperature becomes 500 deg C. or less, not only decomposition of $AsH_3$ is stopped, but also hydrogen radical in the crystal does not exit the crystal and remains in the crystal. That is, in the case where $AsH_3$ is supplied at the stage when the process temperature becomes 500 deg C. or less, the hydrogen concentration in the crystal is increased. Thereby, inactivation of p-type impurity by bonding a hydrogen atom with p-type impurity is increased, and the carrier concentration is lowered. Thus, resistance of the upper DBR layer 15 is increased, and life due to heat generation at the time of operation is lowered. As described above, increased hydrogen concentration in the crystal leads to lowering of reliability of the laser diode 1. Thus, at the time of stopping supply of $AsH_3$, the process temperature is preferably 500 deg C. or more.

Accordingly, in light of face roughing due to As removal and lowering reliability, it is found that it is preferable to stop supply of $AsH_3$ at the time when the process temperature is in the range from 500 deg C. to 700 deg C. both inclusive.

Further, the process temperature at the time of stopping supply of $AsH_3$ is preferably changed according to the Al composition in the upper DBR layer 15. Specifically, the process temperature at the time of stopping supply of $AsH_3$ is preferably changed according to the magnitude of the Al composition of the layer having the largest Al composition out of the semiconductor layers mainly included in the upper DBR layer 15. For example, a description will be given of a case that the upper DBR layer 15 has a structure in which the low-refractive index layer 15A having the Al composition of 0.9 or more and the high-refractive index layer 15B having the Al composition smaller than that of the low-refractive index layer 15A are alternately layered. In this case, it is preferable to stop supply of $AsH_3$ at the process temperature suitable for the Al composition of 0.9 of the low-refractive index layer 15A (for example, from 600 deg C. to 700 deg C. both inclusive). Since hydrogen radical easily remains in the crystal at low temperature (for example, under 600 deg C.), the process temperature at the time of stopping supply of $AsH_3$ is preferably high when the Al composition is large.

In some cases, the current narrowing layer 17 is provided in the upper DBR layer 15. However, in such a case, the ratio of the current narrowing layer 17 occupies in the upper DBR layer 15 is extremely small, and influence of the current narrowing layer 17 is extremely small. Therefore, in this case, even if the Al composition of the material composing the current narrowing layer 17 is larger than the Al composition of the low-refractive index layer 15A, the Al composition of the low-refractive index layer 15A is preferably used as an assumed Al composition in considering stopping supply of $AsH_3$.

Next, a description will be given of to what degree hydrogen incorporation into the crystal is able to be inhibited by the foregoing manufacturing method. The degree of hydrogen incorporation is able to be known by measuring the carrier concentration in the crystal.

The carrier concentrations described in the following cases 1 and 2 are a measurement value in the case where the process temperature at the time of stopping supply of $AsH_3$ is 600 deg C. The carrier concentrations described in the following cases 3 and 4 are a measurement value in the case where the process temperature at the time of stopping supply of $AsH_3$ is 400 deg C. Further, the carrier concentrations described in the following cases 1 and 3 are a carrier concentration of p-type $Al_{0.3}Ga_{0.7}As$ in the case where p-type $Al_{0.3}Ga_{0.7}As$ and p-type GaAs are sequentially formed on a GaAs substrate. The carrier concentrations described in the following cases 2 and 4 are a carrier concentration of p-type $Al_{0.9}Ga_{0.1}As$ in the case where p-type $Al_{0.9}Ga_{0.1}As$ and p-type GaAs are sequentially formed on a GaAs substrate by using the foregoing method. In the all following cases 1 to 4, raw material gas containing C ($CB_4$) is used as p-type impurity. The flow rate of $CB_4$ is 300 sccm in the following cases 1 and 3, and 100 sccm in the following cases 2 and 4. The C concentrations described in the following cases 2 and 4 are obtained by measuring the concentration of C mixed in the crystal (concentration including both activated one and inactivated one) by using SIMS (Secondary Ion-microprobe Mass Spectrometry).

| | p-type semiconductor layer | Process temperature (deg C.) | Carrier concentration (cm$^{-3}$) | C concentration (cm$^{-3}$) |
|---|---|---|---|---|
| Case 1 | $Al_{0.3}Ga_{0.7}As$ | 600 | $4.7 \times 10^{18}$ | |
| Case 2 | $Al_{0.9}Ga_{0.1}As$ | 600 | $4.0 \times 10^{18}$ | $5.0 \times 10^{18}$ |
| Case 3 | $Al_{0.3}Ga_{0.7}As$ | 400 | $3.2 \times 10^{18}$ | |
| Case 4 | $Al_{0.9}Ga_{0.1}As$ | 400 | $2.6 \times 10^{18}$ | $5.0 \times 10^{18}$ |

From the result, it is found that in the case where the process temperature at the time of stopping supply of AsH$_3$ is 600 deg C., the carrier concentration in the crystal is extremely larger than that in the case where the process temperature at the time of stopping supply of AsH$_3$ is 400 deg C. Accordingly, it is found that in the case where the process temperature at the time of stopping supply of AsH$_3$ is 600 deg C., hydrogen incorporation into the crystal is able to be more effectively inhibited than in the case where the process temperature at the time of stopping supply of AsH$_3$ is 400 deg C. Further, from the foregoing result, it is found that the activation ratio of C contained in $Al_{0.9}Ga_{0.1}As$ (=(carrier concentration/C concentration)×100) is 80% in case 1, and 52% in case 4. In practice, samples in which the activation ratio is 90% or 100% exist in case 2. In case 2, it is able to assume that the lower limit of the activation ratio is 80%. Meanwhile, in case 4, no samples in which the activation ratio exceeds 52% exist. Thus, it is able to assume that the upper limit of the activation ratio is 52% in case 4.

Next, a description will be given of to what degree the long-term reliability of the laser diode 1 is improved by the foregoing manufacturing method. The improvement degree of the long-term reliability is able to be known by observing change with time of electric power injected into the laser diode 1.

Figure 6:
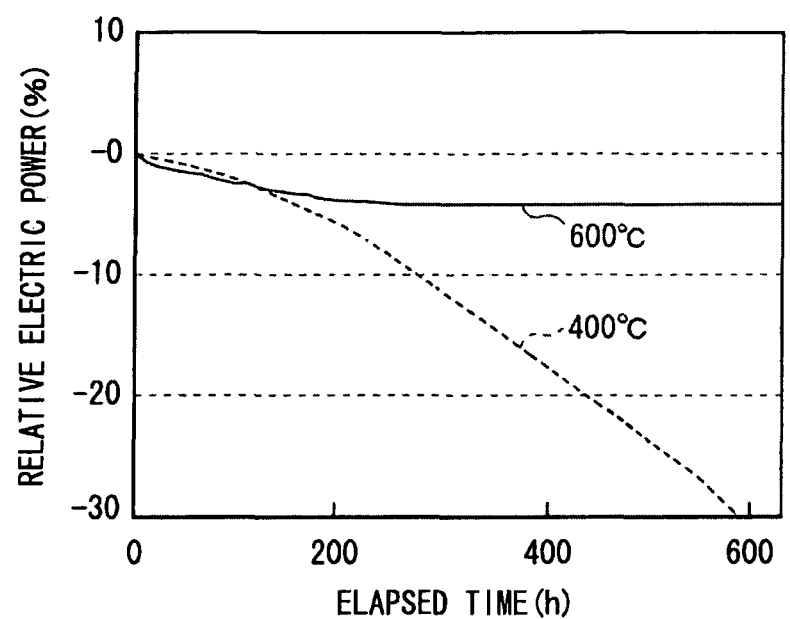
FIG. 6 is a diagram illustrating long-term reliability of light output in the laser diode of this embodiment and a laser diode according to a comparative example.

FIG. 6 illustrates the change with time of electric power injected into the laser diode 1. The solid line in FIG. 6 indicates a case in which the process temperature at the time of stopping supply of AsH$_3$ is 600 deg C., and the dashed line in FIG. 6 indicates a case in which the process temperature at the time of stopping supply of AsH$_3$ is 400 deg C. From FIG. 6, it is found that in the case where the process temperature at the time of stopping supply of AsH$_3$ is 600 deg C., injected electric power into the laser diode 1 is almost constant, and long-term reliability is significantly favorable. Meanwhile, it is found that in the case where the process temperature at the time of stopping supply of AsH$_3$ is 400 deg C., injected electric power into the laser diode 1 is drastically decreased, and long-term reliability is significantly low. The tendency shown by the dashed line in FIG. 6 is shown in almost all cases in which the process temperature at the time of stopping supply of AsH$_3$ is the temperature at which decomposition of AsH$_3$ is stopped (under 500 deg C.). Accordingly, in the case where the process temperature at the time of stopping supply of AsH$_3$ is 600 deg C., long-term reliability of the laser diode 1 is higher than that in a case that the process temperature at the time of stopping supply of AsH$_3$ is the temperature at which decomposition of AsH$_3$ is stopped (under 500 deg C.).

3. Action and Effect

In the laser diode 1 of this embodiment, in the case where a given voltage is applied to between the upper electrode 18 and the lower electrode 19, a current is injected into the active layer 13 thorough the current injection region 17B, and thereby light due to electron-hole recombination is generated. Such light is reflected by the pair of the lower DBR layer 11 and the upper DBR layer 15. Laser oscillation is generated at a given wavelength, and the light is emitted as a laser beam outside from the light emitting aperture 18A of the upper electrode 18.

In the laser diode 1 of this embodiment, the activation ratio of the p-type impurity contained in the upper DBR layer 15 is 80% or more. That is, inactivation of the p-type impurity due to hydrogen radical is hardly shown. Thus, a high carrier concentration is obtained with little crystal defect, and a low resistance value is obtained. Such a high activation ratio is not able to be realized in the existing manufacturing methods in which a doping with large amount of dopant is made, or supply of AsH$_3$ is stopped under temperature conditions in which decomposition of AsH$_3$ is stopped at the time of temperature drop after crystal growth. Such a high activation ratio is able to be obtained by the foregoing simple method. Accordingly, the upper DBR layer 15 in which inactivation of the p-type impurity due to hydrogen radical is hardly shown and the laser diode 1 including the same are able to be obtained by a simple method.

Further, in the method of manufacturing the laser diode 1 of this embodiment, supply of AsH$_3$ is stopped when the process temperature is 500 deg C. or more. That is, supply of AsH$_3$ is stopped under temperature conditions in which decomposition of AsH$_3$ is not stopped. Thus, hydrogen ratio remaining in the upper DBR layer 15 is able to be decreased than a case that supply of AsH$_3$ is stopped under temperature conditions in which decomposition of AsH$_3$ is stopped. Thereby, inactivation impurity due to hydrogen radical is able to be inhibited. Thus, a high carrier concentration is able to be obtained, and a low resistance value is able to be obtained. Further, at the time of stopping supply of AsH$_3$, new gas is not separately supplied. Thus, an additional raw material and switching gas and the like are not needed. Accordingly, in the manufacturing method, inactivation of impurity is able to be inhibited by the simple method.

While the descriptions have been hereinbefore given of the invention with reference to the embodiment, the invention is not limited to the foregoing embodiment, and various modifications may be made.

For example, in the foregoing embodiment, the description has been given of the case that the invention is applied to the upper DBR layer 15 mainly containing p-type AlGaAs. However, it is needless to say that the invention is applicable to a semiconductor layer that mainly contains a material with which inactivation of p-type impurity due to hydrogen radical is generated.

The present application contains subject matter related to that disclosed in Japanese Priority Patent Application JP 2009-098020 filed in the Japan Patent Office on Apr. 14, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a semiconductor layer, comprising:
   forming a p-type semiconductor layer of a laminated body containing As by epitaxial growth by supplying AsH$_3$ and a first raw material gas containing a p-type impurity element, the laminated body including a first semiconductor layer containing As and an Al composition formed by epitaxial growth by supplying of the AsH$_3$, the first raw material, and a second raw material gas containing Al, the Al composition of the first semiconductor layer being 0.9 or more;

stopping the supply of the AsH$_3$ without separately supplying a new gas when a process temperature equals a target chamber temperature set to 500 degrees Celsius or more and after the p-type semiconductor layer is formed; and changing the target chamber temperature when the supply of the AsH$_3$ is stopped to a subsequent temperature based on a magnitude of an Al composition of a semiconductor layer having a largest Al composition out of the semiconductor layers, wherein the laminated body has a structure in which the first semiconductor layer and a second semiconductor layer having an Al composition smaller than the Al composition of the first semiconductor layer are alternately layered.

2. The method of manufacturing a semiconductor layer according to claim 1, wherein supply of AsH$_3$ is stopped concurrently with starting temperature drop.

3. The method of manufacturing a semiconductor layer according to claim 1, wherein supply of AsH$_3$ is stopped during a process temperature drop.

4. The method of manufacturing a semiconductor layer according to claim 1, wherein the target chamber temperature is set to a temperature within a range from 500 degrees Celsius to 700 degrees Celsius, both inclusive.

5. The method of manufacturing a semiconductor layer according to claim 1, wherein the target chamber temperature is set to a temperature within a range from 600 degrees Celsius to 700 degrees Celsius, both inclusive.

6. The method of manufacturing a semiconductor layer according to claim 1, wherein an activation ratio of the p-type impurity is 80% or more in the laminated body.

7. A method of manufacturing a laser diode comprising:

forming a laminated structure by sequentially forming an n-type semiconductor layer, an active layer, and a p-type semiconductor layer, wherein the p-type semiconductor layer is formed by epitaxial growth by supplying AsH$_3$ and a first raw material gas containing a p-type impurity element; and after the p-type semiconductor layer is formed, stopping the supply of the AsH$_3$ without separately supplying new gas when process temperature equals a target chamber temperature set to 500 degrees Celsius or more; and changing the target chamber temperature when the supply of the AsH$_3$ is stopped to a subsequent temperature based on a magnitude of an Al composition of a semiconductor layer having a largest Al composition out of the semiconductor layers, wherein the laminated structure has a structure in which the p-type semiconductor layer and a second semiconductor layer having an Al composition smaller than the Al composition of the p-type semiconductor layer are alternately layered.

8. The method of manufacturing a laser diode according to claim 7, wherein an activation ratio of the p-type impurity is 80% or more in the laminated body.

* * * * *